United States Patent [19]

Nakamoto

[11] Patent Number: 5,545,980

[45] Date of Patent: Aug. 13, 1996

[54] OPTICAL SENSOR

[75] Inventor: Masayuki Nakamoto, Yokohama, Japan

[73] Assignee: Kabushiki Kaisha Toshiba, Kawasaki, Japan

[21] Appl. No.: 547,337

[22] Filed: Oct. 24, 1995

Related U.S. Application Data

[62] Division of Ser. No. 473,778, Jun. 6, 1995, Pat. No. 5,510,703, which is a division of Ser. No. 993,064, Dec. 18, 1992, Pat. No. 5,451,864.

[30]   Foreign Application Priority Data

Dec. 19, 1991   [JP]   Japan ................... 3-337109

[51] Int. Cl.⁶ ........................................... G01R 33/06
[52] U.S. Cl. ............................. 324/96; 324/117 R
[58] Field of Search ..................... 324/96, 117 R, 324/244.1, 251, 252, 244; 359/280, 248, 215; 250/227.14; 356/364, 400

[56]   References Cited

U.S. PATENT DOCUMENTS 4,002,975   1/1977   Erickson et al. ................ 324/96
4,531,092   7/1985   Shibano ........................... 324/96
4,899,042   2/1990   Falk et al. ........................ 324/96

*Primary Examiner*—Vinh P. Nguyen
*Attorney, Agent, or Firm*—Oblon, Spivak, McClelland, Maier & Neustadt, P.C.

[57]   ABSTRACT

An optical sensor comprising: a light irradiation means for irradiating a linearly polarized light having a wavelength of 740 to 890 nm; a magneto-optical element having a composition of $Y_{3-x}Tb_xFe_5O_{12}$ ($0.3 \leq x \leq 0.8$) for Faraday rotating the linearly polarized light to output a rotated polarized light; and a detecting means for modulating in intensity the rotated polarized light which has been Faraday rotated by the magneto-optical element and detecting a light output of the rotated polarized light from the magneto-optical element. This magneto-optical sensor has a high sensibility and an excellent temperature characteristics under condition of low-magnetic field. When the optical sensor 10 is additionally provided with an electro-optical element having Pockels effect in parallel to the magneto-optical element, it becomes possible to measure not only current intensity but also voltage intensity.

1 Claim, 5 Drawing Sheets

OPTICAL SENSOR

This is a Division of application Ser. No. 08/473,778 filed on Jun. 6, 1995 (U.S. Pat. No. 5,510,703), which is a Division of Ser. No. 07/993,064 filed Dec. 18, 1992 now U.S. Pat. No. 5,451,864.

BACKGROUND OF THE INVENTION

1. Field of the Invention

The present invention relates to an optical sensor for measuring magnetic field intensity or current intensity on the basis of magneto-optical effect i.e., Faraday effect, and for measuring electric field intensity or voltage on the basis of electro-optical effect i.e., Pockels effect, more particularly to an optical sensor providing high sensitivity and excellent temperature characteristics in a low magnetic field range.

2. Related Art

In recent years, in accordance with a progress of digital technology and computor technology, information processing technologies such as LAN (Local Area Network) which is established by combining optical technology with the digital tecnology or the computor tecnology, has been made remarkable advances. As the progress of the information processing technology, enen in electric power industry, various types of optical sensors for measuring voltage or current intensity have been developed to protect and detect the fault of electric power systems such as the earth fault, the short circuit, and the breakage of cable or wire, or control the electric power system.

Among such optical sensors, magneto-optical sensors for measuring current intensity using the Faraday effect (magneto-optical effect) and electro-optical sensors for measuring voltage using the Pockels effect have been energetically studied. The magneto-optical sensors are used for magnetic field measurement. However, when the magnetic field is induced by current, the current intensity can also be measured by the magneto-optical sensor on the basis of a relationship between current intensity and magnetic field intensity defined in Biot-Savart law.

On the other hand, when a linearly polarized light is incidented into an electro-optical element (Pockels effect element) which is located in an electric field to be measured by the electro-optical sensor, refractive indexes with respect to orthogonal components of the linearly polarized light are varied, so that a phase difference is imparted between the orthogonal components of the polarlized light thereby to output a retarded polarlized light. This phenomenon is called "Retardation". The electro-optical sensor is used for obtaining the electric field intensity or voltage by measuring the aforementioned phase difference of the polarlized light as a variation of the light intensity.

FIG. 6 shows a block diagram of a conventional magneto-optical sensor. The magneto-optical sensor shown in FIG. 6 comprises collimators $3a$ and $3b$, a polarizer 4, a Faraday element (magneto-optical element) 5, analizer 6, which are linearly arranged in this order, a light source 1 connected to the collimator $3a$ through an optical fiber $2a$, and a light receiving signal unit 7 connected to the collimator $3b$ through an optical fiber $2b$.

A light beam irradiated from the light source 1 and having a predetermined wavelength passes through a transmission path composed of the optical fiber $2a$, and reaches to the collimator $3a$. Then, the collimator $3a$ controls a course of the light to form a paralell light flux. Thereafter, the paralell light flux is converted by the polarizer 4 into a linearly polarized light.

The linearly polarized light, on entering the Faraday element 5 located at a position where the magnetic field strength is to be measured, rotates a polarization plane in proportional to the magnetic field intensity. A transmitted light from the Faraday element 5 is then intensity modulated by the analyzer 6. Subsequently, the transmitted light from the analizer 6 is converged into a paralell light flux by the collimator $3b$, and then the parallel light flux is transmitted to the light receiving signal unit 7 through the optical fiber $2b$. The light receiving signal unit 7 converts the parallel light flux into an electrical signal having a level corresponding to the intensity of the parallel light flux. Therefore, the magnetic field intensity can be measured from the obtained electrical signal.

Faraday rotation angle θ i.e., the rotation angle θ of the polarization plane by the Faraday rotation effect is expressed by the following equation (1):

$$\theta = V \cdot H \cdot L \tag{1}$$

where V, H and L denote Verdet constant, magnetic field intensity and light path length of the Faraday element 5, respectively.

Further, a light output $P_{OUT}$ of which intensity is modulated by the analizer 6 after the Faraday rotation is expressed by the following equation (2):

$$P_{OUT} = K(1 + \sin 2\theta) \tag{2}$$

wherein K denotes a constant.

Accordingly, if the electrical signal converted from the light output $P_{OUT}$ by the light receiving signal unit 7 is measured, the magnetic field intensity in the Faraday element 5 can be obtained.

Furthermore, in the case that the magnetic field is caused by current flowing through an electric conductor, the current intensity can be similarly obtained from the electrical signal. At this time, a linear relationship exists between θ and $P_{OUT}$ in a small θ value range.

The representative chemical compounds providing Faraday effect are as follows: diamagnetic materials such as ZnSe having a Verdet constant V of $0.34 \times 10^{-2}$ deg/Oe·cm at a wavelength of 820 nm, $Bi_{12}SiO_{20}$ having a Verdet constant V of $0.16 \times 10^{-2}$ deg/Oe·cm at a wavelength of 870 nm, $Bi_{12}GeO_{20}$ having a Verdet constant V of $0.31 \times 10^{-2}$ deg/Oe·cm at a wavelength of 850 nm, and the like.

Further, the following equation (3) is derived from the aforementioned equations (1) and (2):

$$P_{OUT} = K(1 + \sin 2 V H L) \tag{3}$$

Apparently, in terms of the relationship expressed in the equation (3), it is confirmed that an accuracy of the magneto-optical sensor corresponding to the intensity of the light output $P_{OUT}$ depends on a magnitude of the Verdet constant of the Faraday element to a great extent.

However, the Verdet constants of the conventional Faraday elements are small to get good sensitivity. Thus, in the electric power system, sufficient sensitivity and light output can be obtained only in the high current range, i.e., in the high magnetic field range, around high power transmission lines, by the usage of the magneto-optical sensor using the conventional Faraday element.

Consequently, it is difficult to get good sensitivity and high accuracy in the low current range, i.e., in the low magnetic field range.

If the low current measurement or the low magnetic field measurement by the conventional magneto-optical sensor is required, in other words, if the increase of the light output $P_{out}$ in the low current range or in the low magnetic field range is needed, it is required to increase the optical path length L of the Faraday element, as is evident from the relationship expressed in equation (3). However, in the case that the magneto-optical sensor having a quite long Faraday element is used in the high-current range or in the high-magnetic field range, the value of θ becomes so high that the linear relationship between the modulation degree M of the light intensity, which is equal to the value of Ksin2θ expressed in equation (2), and the value of θ is deteriorated, that is, the measurement error are increased.

Furthermore, the enlargement of the optical path length of the Faraday element also results in the deterioration of a feature, i.e., miniaturization which is originally considered to be the most excellent feature of this type of the magneto-optical sensor.

On the other hand, there has been a case where a rare earth iron garnet is used as a material for the Faraday element. The typical example thereof may include $Y_3Fe_5O_{12}$, so-called, YIG (yttria-indium-garnet) crystal which has a Verdet constant of 0.11 deg/Oe·cm with respect to a light having a wavelength of 1300 nm which is in an infrared region. The rare earth-iron-garnet has a high Verdet constant, so that it is possible to perform the measurement with high accuracy even under the conditions of low-current or low-magnetic field.

However, the Verdet constant of the rare earth-iron-garnet disadvantageously varies widely depending on temperature variation. For example, the Verdet constant thereof varies from −8% to +12% in a temperature range of −20° C. to +80° C. Namely, a temperature characteristic (temperature dependence) of the Faraday element is inferior indeed. Accordingly, when the magneto-optical sensor having such Faraday element composed of rare earth-iron-garnet is used in the electric power system, the measuring operation is usually performed in out-door field, so that the Faraday element will be subjected to a large temperature variation due to a weather condition or solar radiation. Therefore, it is difficult to measure a magnetic field intensity with high accuracy, and also to adapt the sensor to a practical use.

On the other hand, as another Faraday element composed of rare earth-iron-garnet crystal of which Verdet constant is improved in temperature dependence, there has been known that one composed of $Y_{3-x}Tb_xFe_5O_{12}$ ($0.3 \leq x \leq 0.8$) containing terbium element (Tb). It has been known that the most effective and preferable wavelength for such Faraday element to realize an excellent light transmission property is a range of 1.1 to 2.0 μm. As a example of the temperature characteristic of the Faraday element being operated in aforementioned wavelength range and the temperature range of −20° C. to +80° C., there has been found a Faraday element in which temperature variation of the Verdet constant is ±1 to ±6% or less at the wavelength of 1.15 μm.

In spite of the fact, when the aforementioned Faraday element is actually used in the magneto-optical sensor, however, an absolute value of the Verdet constant at a wavelength of 1.15 μm still remains to about 0.12 to 0.20 deg/Oe·cm. Therefore, in order to increase the Faraday rotation angle in a low-current or low-magnetic field condition and to obtain a suffucient light output, there is no way other than increasing the optical path length (thickness) L of the Faraday element as easiliy understood from equation (1).

As the result, when aforementioned rare earth-iron-garnet crystal is tried to be adapted for forming the practical Faraday element, a film thickness i.e., the thickness of the Faraday element is required to be from 280 μm to 1 mm or more.

However, in a LPE (Liquid Phase Epitaxial) method which is now considered to be the most effective or available method for manufacturing of this type of the thin film, when the film thickness for the Faraday element exceeds 250 μm, defectives such as camber and crack or the like are disadvantageously occurred in the thin film during the epitaxial growth of the crystal under the high temperature. This is because that there may be exist a large difference between a lattice constant (12.383 Å) of a GGG (gadolinium-gallium-garnet) sustrate which is generally used as a growth substrate for forming the thin film and a lattice constant (12.388 Å in case of x=0.6) of $Y_{3-x}Tb_xFe_5O_{12}$, and because that a thermal expansion coefficient of $Y_{3-x}Tb_xFe_5O_{12}$ is larger than that of GGG substrate.

On the other hand, in a case where the thin film to be used for the Faraday element is manufactured by utilizing a flux method, the thin film is produced in a bulk-form, so that aforementioned problems occurred in the LPE method can be avoided. However, crystalization property of a product is inferior, so that it takes much labor hours to form the product into a film form, thus results in deterioration of mass-productivity of the thin film.

Further, as is already described in the case of the Faraday element composed of diamagnetic material, when the film thickness is largely set to from 280 μm to 1 mm or more, such a thick film will obstruct miniaturization of the outstanding magneto-optical sensor. In addition, in a case where the magnetic field intensity or current intensity becomes high, such a thick film also results to deteriorate the linear relationship between the modulating degree M of the light intensity and the Faraday rotation angle θ.

Furthermore, there is posed another problem that the magneto-optical sensor having a Faraday element composed of $Y_{3-x}Tb_xFe_5O_{12}$ ($0.3 \leq x \leq 0.8$) is available for measuring low-magnetic field and low-current, however, a value of saturated magnetic field of the Faraday element is about 1400 to 1800 oersted. Therefore, when a measuring operation is performed in high-magnetic field or high-current such as to exceed 10000 oersted, the Faraday rotation angle of the element is saturated, so that it becomes impossible to perform the measuring operation. Accordingly, as is the same manner as in case of the aforementioned Faraday element composed of diamagnetic material which is able to measure only high-magnetic field and high-current, there may be posed difficulties such that the magneto-optical sensor cannot be applied to the electric power system wherein a wide range of magnetic field strength and variable current are involved with a high possibility.

On the other hand, a waveband of the linear polarlized light to be applied to the conventional magneto-optical sensor for measuring the aforementioned current intensity is quite different from that of the electro-optical sensor, so that it is impossible to commonly utilize a single signal processing system, and to miniaturize a size of the sensor. Therefore, aforementioned two kinds of optical sensors such as the conventional magneto-optical sensor and the electro-optical sensor are separately manufactured as an independent sensor equipment, respectively. Accordingly, it is impossible to measure both current and voltage intensity by utilizing a single miniaturized sensor at the same measuring time.

SUMMARY OF THE INVENTION

The present invention has been achieved to solve these problems and difficulties inherent in the prior art, and an object of the present invention is to provide an optical sensor having an excellent temperature characteristic and a high sensibility in low-magnetic field range, and having a compact size which is excellent in mass productivity thereof.

Another object of the present invention is to provide an optical sensor enabling to perform measuring operation in a wide scope of the magnetic field ranging from low-magnetic field to high-magnetic field.

A further object of the present invention is to provide an optical sensor enabling to measure both current and voltage intensity at about the same measuring time. The optical sensor is constructed by providing an electro-optical element in parallel to the aforementioned magneto-optical element.

In order to solve the aforementioned problems and achieve these objects, in one aspect of the present invention, there is provided a magneto-optical sensor characterized by comprising: a light irradiation means for irradiating a linearly polarized light having a wavelength of 740 to 890 nm; a magneto-optical element having a composition of $Y_{3-x}Tb_xFe_5O_{12}$ ($0.3 \leq x \leq 0.8$) for Faraday rotating the linearly polarized light to output a rotated polarized light; and a detecting means for modulating in intensity the rotated polarized light which has been Faraday rotated by the magneto-optical element and detecting a light output of the rotated polarized light from the magneto-optical element.

In another aspect of the present invention, there is provided a magneto-optical sensor for measuring a magnetic field strength or current intensity in a magnetic field ranging from a low-magnetic field to a high-magnetic field, the magneto-optical sensor characterized by comprising: a light irradiation means for irradiating a linearly polarized light having a wavelength of 740 to 890 nm; a first magneto-optical element for low-magnetic field use which has a composition of $Y_{3-x}Tb_xFe_5O_{12}$ ($0.3 \leq x \leq 0.8$) for Faraday rotating the linearly polarized light to output a first rotated polarized light; a second magneto-optical element for high-magnetic field use which has a higher magnetic field for saturation than that of the first magneto-optical element for Faraday rotating the linearly polarized light to output a second rotated polarized light, which is arranged in parallel to the first magneto-optical element; and detecting means for modulating the first and second rotated polarized lights which have been respectively Faraday rotated by the first and second magneto-optical elements and each detecting the light outputs of the first and second rotated polarized lights.

The thickness of the magneto-optical element may preferably set to 20 to 250 µm.

In further aspect of the present invention, there is provided an optical sensor for measuring a magnetic field intensity, current intensity, electric field intensity and voltage, the optical sensor comprising: a light irradiation means for irradiating a linearly polarized light having a wavelength of 740 to 890 nm; a magneto-optical element having a composition of $Y_{3-x}Tb_xFe_5O_{12}$ ($0.3 \leq x \leq 0.8$) for Faraday rotating the linearly polarized light to output a rotated polarized light; an electro-optical element (Pockels effect element) arranged in parallel to the magneto-optical element, for imparting phase difference equivalent to the electric field intensity to the polarized light so as to output a retarded polarized light; and a detecting means for detecting light outputs of the rotated polarized light which have been Faraday rotated by the magneto-optical element and the retarded polarized light which has been imparted with the phase difference by the electro-optical element.

In the optical sensor defined in claim 1, a ferromagnetic body crystal having a composition of $Y_{3-x}Tb_x{}_{Fe_5}O_{12}$ ($0.3 \leq x \leq 0.8$) which has an excellent Faraday effect in low-magnetic field is used as a material for the magneto-optical element on the basis of the findings obtained by the inventor of this invention.

Namely, the inventor has found a fact of that the crystal having a composition of $Y_{3-x}Tb_xFe_5O_{12}$ ($0.3 \leq x \leq 0.8$) has a sufficiently high Verdet constant with respect to a polarized light having a wavelength ranging from 740 to 890 µm in spite of the fact that the crystal had not been paid attention heretofore because the crystal seems to be inferior in light transmitting property. The inventor has also found that if the film thickness of the magneto-optical element composed of the crystal is 20 to 250 µm, an effectiveness for increasing the Faraday rotation angle becomes larger than loss of the light which is absorbed by the magneto-optical element thereby to increase an output level of the light outputted from the detected means. Therefore, high sensitivity in low-magnetic field range can be obtained. As a matter of course, a deviation from a stoichiometric ratio of the crystal may be allowed to some extent, as far as the intended effectiveness of the present invention can be substantially obtained.

Further, the film thickness of the magneto-optical element is set to 250 µm or less, so that the film can be mass produced by utilizing the LPE method, and also it becomes possible to realize to miniaturize an entire capacity of the magneto-optical sensor. By the way, the film thickness of the magneto-optical element may be preferably set to 20 to 250 µm, more preferably to 30 to 180 µm, most preferably to 80 to 150 µm from a view point of mass-productivity thereof.

Next, the optical sensor defined in claim 5 is constructed by providing: the first magneto-optical element defined in claim 1 which is used as a magneto-optical element for low-magnetic field use; and the second magneto-optical element for high-magnetic field use which has a higher saturated magnetic field than that of the first magneto-optical element for low-magnetic field use.

The second magneto-optical element for high-magnetic field use is auxially provided for the purpose of measuring a high-magnetic field or a high-current in which the the magneto-optical element for low-magnetic field use is impossible to measure such a high magnetic field or high-current because the Faraday rotation angle of the magneto-optical element for low-magnetic field use is saturated due to the magnetic saturation, or the linear relationship between the intensity of light output and the magnetic field intensity will be lost.

As a material for forming the second magneto-optical element, it is preferable to use diamagnetic materials such as ZnSe, $Bi_{12}SiO_{20}$, $Bi_{12}GeO_{20}$ or the like, and paramagnetic materials such as lead glass or the like. A magnetization degree of these materials is not so large even under the condition of high-magnetic field, and the Faraday rotation angle thereof is also not so large as that of the aforementioned first magneto-optical element. Furthermore, there may be no fear of occurring the magnetic saturation.

In this case, the detecting means determines a predetermined light output as a boundary output within a scope of magnetic field intensity ranging from a low-magnetic field to a high-magnetic field on the basis of the Faraday effect characteristics of the first and second magneto-optical elements.

As the result, in a case where the magnetic field intensity to be measured is seemed to be lower than the boundary output, the magnetic field intensity is measured on the basis of the light output transmitted from the first magneto-optical element for low-magnetic field use.

On the contrary, in a case where the magnetic field intensity to be measured is seemed to be higher than the boundary output, the magnetic field intensity is measured on the basis of the light output transmitted from the second magneto-optical element for high-magnetic field use. Accordingly, it becomes possible to perform a measuring operation for the magnetic field intensity or current intensity in the wide scope of the magnetic field intensity while retaining an adequate sensitivity and linear relationship between the magnetic field intensity and the light output.

Next, the optical sensor defined in claim 8 is constructed by providing an electro-optical element (Pockels effect element) system with the optical sensor system defined in claim 1. The electro-optical element has a Pockels effect with respect to the linear polarized light having a wavelength of 740 to 890 nm, and is arranged in parallel to the magneto-optical element used in the optical sensor system for measuring magnetic field intensity or current intensity. In addition, a means for irradiating the linearly polalized light and a means for detecting the light outputs from the both elements are commonly used in the optical sensor 60.

The sensitivity of detecting the light output increases in proportional to increase the electro-optical coefficient (Pockels coefficient) of the electro-optical element. The representative examples of a material for constituting the electro-optical element may include: $LiNbO_3$ (lithium niobate, Pockels coefficient: $\gamma_{22}=5.2\times10^{-10}$ cm/V, wavelength to be used for measuring: 850 nm), $Bi_{12}GeO_{20}$ (BGO, Pockels coefficient: $\gamma_{41}=5.2\times10^{-10}$ cm/V, wavelength to be used for measuring: 850 nm), $Bi_{12}SiO_{20}$ (BSO, Pockels coefficient: $\gamma_{41}=4.4\times10^{-10}$ cm/V, wavelength to be used for measuring: 870 nm), or the like.

When the linearly polarlized light is incidented into the aforementioned electro-optical element located in an electric field, refractive indexes of the element with respect to orthogonal components of the linearly polarlized light are varied in accordance with the intensity of the outer electric field, so that phase difference $\Gamma$ is imparted between the orthogonal components of the polarlized light, thereby to output a retarded polarlized light. The polarlized light imparted with the phase difference$\Gamma$ is then modulated in intensity by the light detecting means, and is finally converted into an electric signal. As the result, the electric field intensity and the applied voltage are measured in accordance with the magnitude of the electric signal.

The nature, utility, and further features of this invention will be more clearly apparent from the following detailed description with respect to preferred embodoments of the invention when read in conjunction with the accompanying drawings briefly described below.

DESCRIPTION OF THE PREFERRED EMBODIMENT

Hereinbelow, the preferred embodiment of this invention will now be explained with reference to the accompanying drawings.

[Embodiments 1 to 6 and Comparative Examples 1 to 2]

Figure 1:
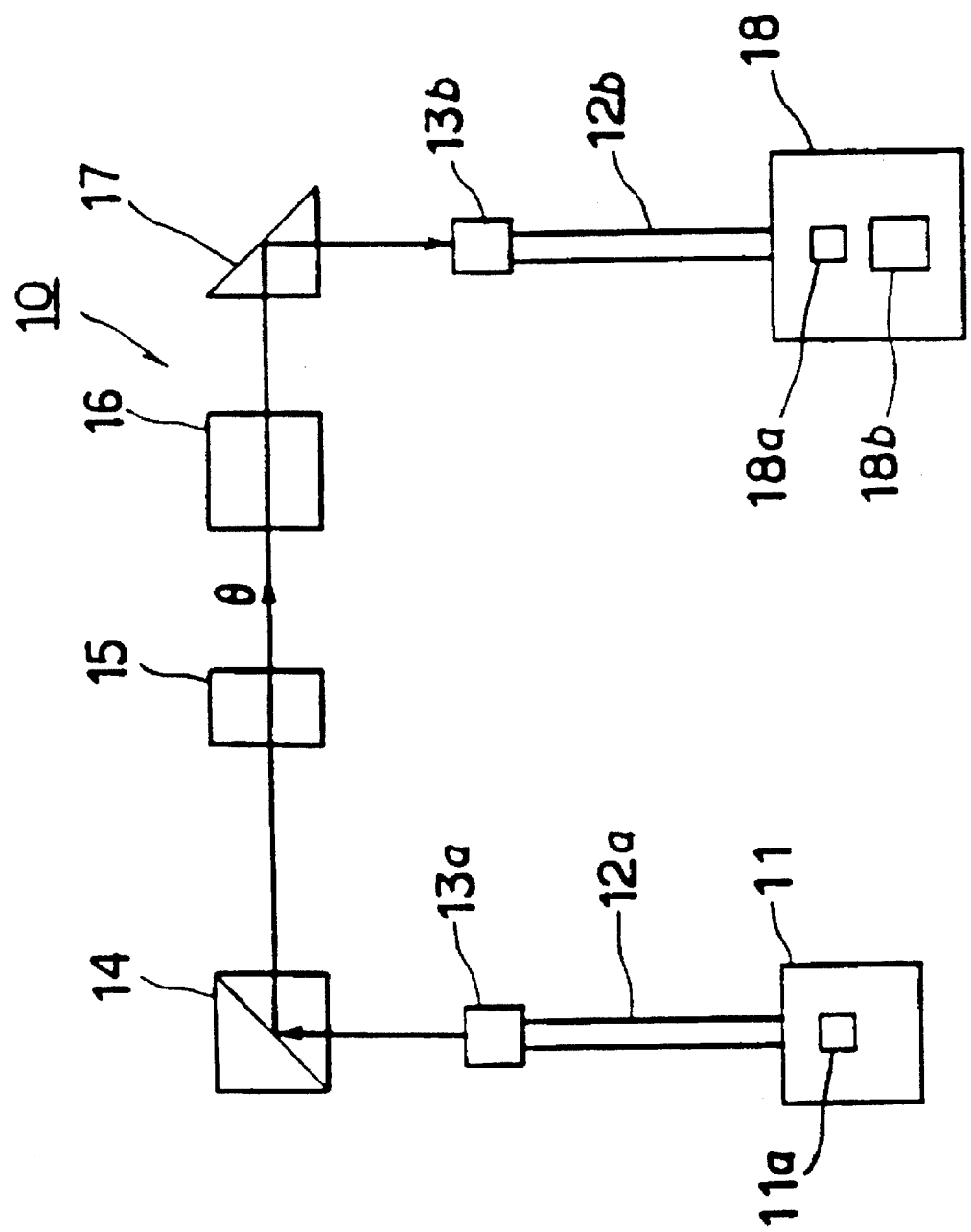
FIG. 1 is a block diagram showing an embodiment of an optical sensor according to the present invention.

FIG. 1 is a block diagram showing a construction of embodiments 1 to 6 of a magneto-optical sensor 10 according to the present invention. That is, the magneto-optical sensor 10 comprises a light irradiating unit 11 as a light irradiating means for irradiating a light beam, the light irradiating unit 11 further comprising a light source 11a such as laser diode, LED or the like. The light beam irradiated from the light source 11a is transmitted through an optical fiber 12a and reaches to a collimeter 13a. Then, the light beam is converted by the collimater 13a into a parallel light flux. The parallel light flux is then incidented into a polarizer i.e., a polarizing prism 14 in this case thereby to form a linearly polarized light, and simultaneously a travelling direction of the polarized light is changed by 90 degrees by means of the polarizing prism 14.

The linearly polarized light is then incidented into a Faraday element 15 which is disposed under an influence of an external magnetic field, and the Faraday element 15 is composed of magnetic garnet having a composition of $Y_{2.5}Tb_{0.5}Fe_5O_{12}$. At this time, the linearly polarized light is subjected to a Faraday rotation at an angle of $\theta$ in proportional to the intensity of the external magnetic field.

The Faraday rotated light is subsequently intensity modulated by passing through an analyzer 16 which is disposed obliquely so as to be inclined at an angle of 45 degrees with respect to the polarizer 14. Thereafter, a reflection prism 17 converts the travelling direction of the intensity modulated light so that the light incidents with a collimater 13b thereby to be converted into a parallel light flux. Thereafter, the parallel light flux is transmitted to a light receiving signal unit 18 through an optical fiber 12b.

The light receiving signal unit 18 comprises a light receiver 18a composed of photodiode or the like, and a signal conditioner 18b. The light receiver 18a has a function to convert the incidented light into an electrical signal in proportional to the intensity of the incidented light. The signal conditioner 18b has a function to amplify the electrical signal and to correct the linear relationship in accordance with the equation (2) described above.

Various kinds of Faraday elements 15 each composed of magnetic garnet having a composition of $Y_{2.5}Tb_{0.5}Fe_5O_{12}$ and having a different film thickness (optical path length of the element) ranging from 10 to 253 µm were prepared. On the other hand, six kinds of light sources 11a capable of irradiating a light having one of wavelengths of 740 µm, 750 µm, 770 µm, 850 µm, 880 µm and 890 µm were prepared. Then, each of the light sources 11a is assembled into a construction shown in FIG. 1 to form magneto-optical sensors 10 of Embodiments 1 to 6, respectively. Using each of the magneto-optical sensors 10 and changing the thickness of the Faraday element 15, a light output to be detected by means of the light receiving unit 18 was measured.

On the other hand, two kinds of light sources capable of irradiating a light having one of wavelengths of 720 μm and 900 μm were prepared. Then, each of the light sources is assembled into the construction shown in FIG. 1 to form magneto-optical sensors of Comparative Examples 1 and 2 respectively. Using each of the magneto-optical sensors and changing the thickness of the Faraday element 15, a light output to be detected by means of the light receiving unit 18 was measured. As the Faraday elements 15 used in Comparative Examples 1 to 2, the same as those used in Embodiments 1 to 6 were used.

The material for forming the Faraday element i.e., $Y_{2.5}Tb_{0.5}Fe_5O_{12}$ to be used in Embodiments 1 to 6 and Comparative Examples 1 to 2 corresponds to the rare earth-iron-garnet having a composition of $Y_{3-x}Tb_xFe_5O_{12}$ ($0.3 \leq x \leq 0.8$) wherein the value of X is set to 0.5. As described hereinbefore, this rare earth-iron-garnet shows a high sensitivity in a low-magnetic field or low-current condition.

In this regard, a conventional magneto-optical sensor was prepared in the following manner as a "standard magneto-optical sensor" for standardalizing the data obtained from Embodiments 1 to 6 and Comparative Examples 1 to 2. That is, the standard magneto-optical sensor was constructed by comprising: a Faraday element composed of a material of $Y_{2.5}Tb_{0.5}Fe_5O_{12}$ which is the same as that of Embodiments 1 to 6 and has a thickness of 220 μm; and a light source for irradiating a light having a wavelength of 1.3 μm (1300 nm) selected from the range of 1.1 to 2.0 μm which has been deemed to be the most effective light wavelength with respect to the above-described material for the conventional Faraday element. The arrangements of elements or parts of the standard magneto-optical sensor other than those described above are substantially the same as those of Embodiments 1 to 6.

Then, the light output data obtained from the magneto-optical sensors of Embodiments 1 to 6 and Comparative Examples 1 to 2 were standardized by utilizing the light output obtained from the standard magneto-optical sensor as a reference atandard. The results of the standardization are shown in FIG. 2.

Figure 2:
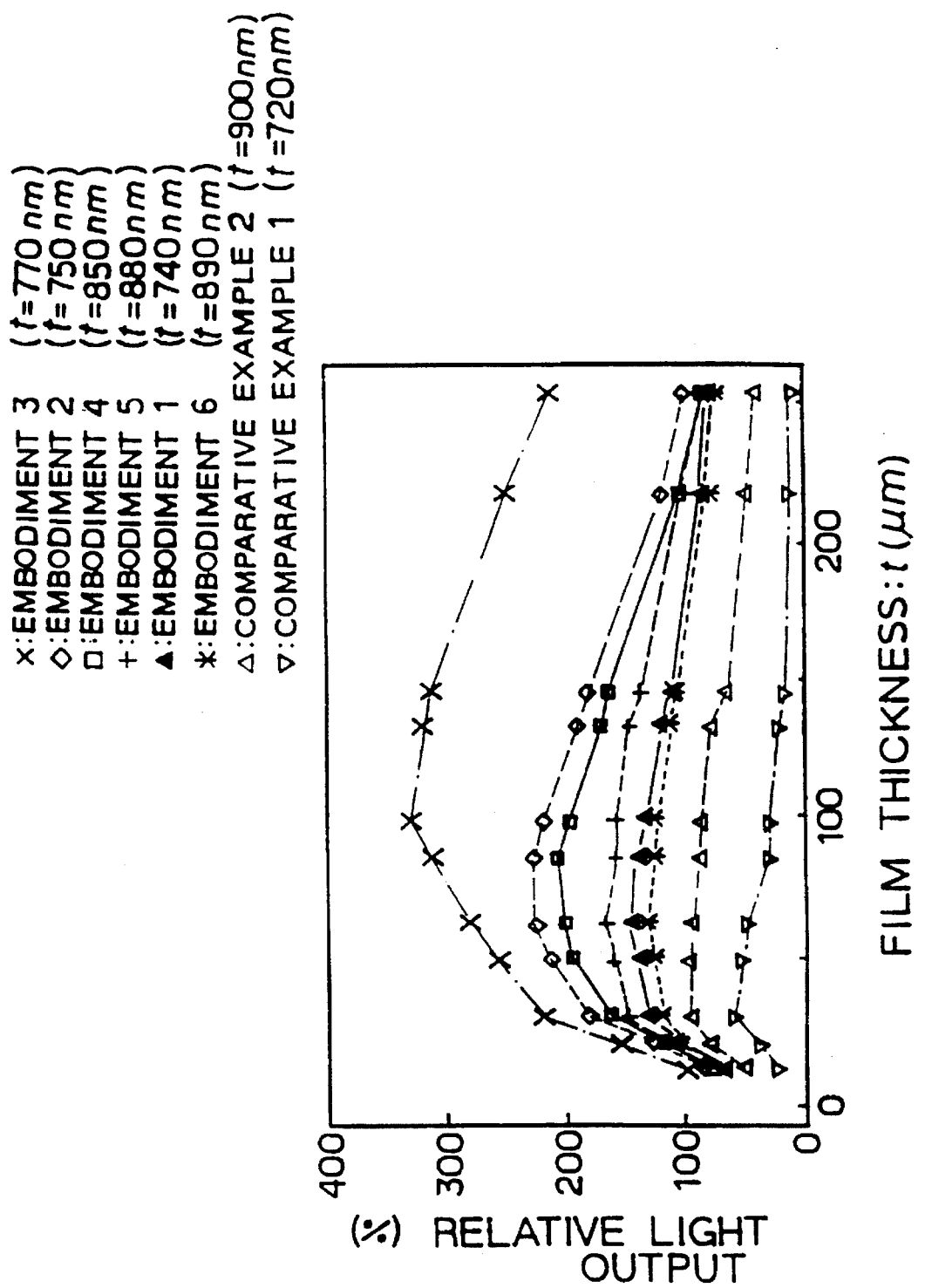
FIG. 2 is a graph showing a relationship between the film thickness of the Faraday element and the relative light output in the magneto-optical sensor shown in FIG. 1.

As is evident from FIG. 2, each of the magneto-optical sensors according to Embodiments 1 to 6 is materially excellent in light transmitting property, and had shown equal or greater light outputs in the range of the film thickness of 10 to 253 μm in comparison with that obtained from the standard magneto-optical sensor wherein the light having a wavelength of 1300 μm which is greater than that of the respective Embodiments 1 to 6 is utilized.

That is, when the wavelength of the light is set to from 740 to 890 μm as is in Embodiments 1 to 6, the YIG crystal having a composition of $Y_{3-x}Tb_xFe_5O_{12}$ ($0.3 \leq x \leq 0.8$) can have a large Verdet constant greater than that of the case wherein the light having a wavelength of 1300 μm was used. Furthermore, when the film thickness of the Faraday element was set to from 10 to 253 μm as is in Embodiments 1 to 6, an advantageous effect of increasing the Faraday rotation angle caused by the increased Verdet constant will be greater than an ill effectiveness of decreasing an amount of light transmission thereby to contribute to increase the light output as a whole.

Among above Embodiments 1 to 6, the magneto-optical sensor of Embodiment 3 had shown the greatest light output in an entire range of the film thickness, and a maximum value of 330% of the relative light output was obtained at the film thickness of 97 μm. On the other hand, the other magneto-optical sensors of Embodiments 1, 2, 4, 5 and 6 had respectively shown a maximum value of the relative light output of 142% at the thickness of 63 μm, a maximum value of 227 to 228% at the thickness of 62 to 85 μm, a maximum value of 208% at the thickness of 85 μm, a maximum value of 165% at the thickness of 63 μm and a maximum value of 126% at the thickness of 63 μm.

However, in the case of the magneto-optical sensors of Comparative Examples 1 and 2, the relative light outputs therefrom were less than 100% in an entire range of the film thickness.

In addition, unusual or surprising results were obtained such that the temperature characteristics of the light outputs corresponding to a rate of change of Verdet constant of each of the magneto-optical element were good enough to be ±1% at the temperature range of −20° to +80° C. with respect to each of the magneto-optical sensors of Embodiments 1 to 6.

Therefore, according to the embodiments of the present invention, there can be provided a magneto-optical sensor having a Faraday element which has a short element length and is enabling to be miniatulized and mass produced by utilizing the LPE method, and the sensor having a high sensibility in low-magnetic field range while retaining an excellent temperature characteristics.

[Embodiment 7]

Figure 3:
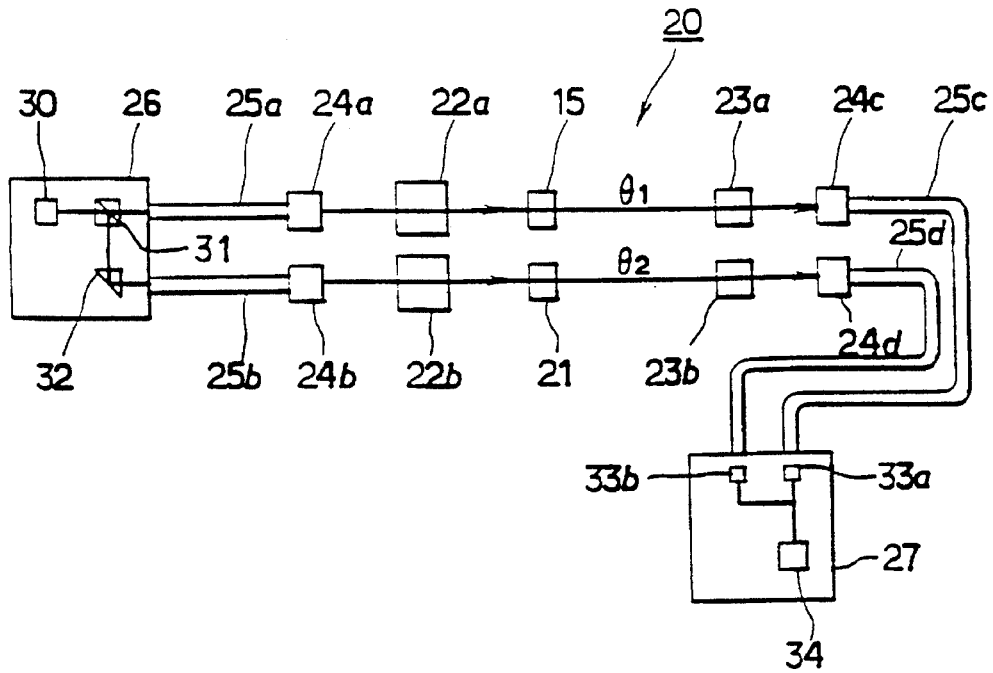
FIG. 3 is a block diagram showing another embodiment of an optical sensor according to the present invention.

FIG. 3 shows a block diagram of an optical sensor according to Embodiment 7 of this invention.

Namely, the optical sensor 20 according to Embodiment 7 comprises two kinds of Faraday elements i.e., a Faraday element for low-magnetic field use and a Faraday element for high-magnetic field use. As the Faraday element for low-magnetic field use, the Faraday element 15 used in the magneto-optical sensor 10 of the aforementioned Embodiments 1 to 6 was used. The Faraday element 15 is composed of a magnetic garnet having a composition of $Y_{2.5}Tb_{0.5}Fe_5O_{12}$ and a film thickness of 80 μm. The Faraday element 21 for high-magnetic field use is composed of the aforementioned diamagnetic material of ZnSn of which film thickness is 5 mm, and the Faraday element 21 is arranged in parallel to the Faraday element 15.

Further, a polarizer 22a, the Faraday element for low-magnetic field use 15 and an analyzer 23a are arranged in a linear form. On the other hand, a polarizer 22b, the Faraday element for high-magnetic field use 21 and an analyzer 23b are also arranged in a linear form. Both of the two linearly arranged elements are provided so as to be adjacent to each other. The analyzers 23a and 23b are respectively disposed obliquely so as to be inclined at an angle of 45 degrees with respect to the polarizers 22a and 22b.

The polarizers 22a and 22b are respectively connected to a light irradiating unit 26 through collimators 24a, 24b and optical fibers 25a, 25b in this order. The analyzers 23a and 23b are respectively connected to a light receiving signal unit 27 through collimators 24c, 24d and optical fibers 25c, 25d in this order.

The light irradiating unit 26 comprises: a light source 30 composed of laser diode, LED or the like for irradiating a light beam having a wavelength of 850 nm; a beam splitter 31 for splitting the light beam irradiated from the light source 30 into two light rays having different directions; and a reflecting prism 32 for changing a travelling direction of one of the light rays splitted by the beam splitter 31.

Further, the light receiving signal unit 27 comprises: light receivers 33a, 33b composed of photodiode or the like for respectively receiving the light rays and converting the light rays into electric signals; and a signal conditioner 34 connected to the light receivers 33a, 33b for amplifying the electrical signals.

In the thus formed magneto-optical sensor 20 according to Embodiment 7, the light beam irradiated from the light source 30 is first incidented into the beam splitter 31 in the light irradiating unit 26, and then splitted into two light rays one of which directs to the optical fiber 25a and another directs to the reflecting prism 32. The light rays incidented into the reflecting prism 32 is converted its travelling direction so as to direct to the optical fiber 25b. Accordingly, the light beam irradiated from the light source 30 is divided into two light rays, which are simultaneously incidented into the optical fibers 25a, 25b and transmit within the optical fibers 25a, 25b. Subsequently, the light rays are respectively changed by the collimators 24a, 24b into parallel light fluxes. After then, the parallel light fluxes are respectively incidented into the polarizers 22a, 22b thereby to be changed into linearly polarized lights.

The two linearly polarized lights are then incidented into the Faraday elements 15, 21 which are disposed under the influence of an external magnetic field, and subjected to Faraday rotations having different Faraday rotation angles of $\theta_1$ and $\theta_2$ respectively.

Then, the Faraday rotated light rays respectively pass through the analyzers 23a, 23b. At this time, the light rays are modulated in intensity and incidented into the collimators 24c, 24d respectively thereby to be changed into parallel light fluxes.

Thereafter, the parallel light fluxes are respectively incidented into the light receivers 33a, 33b provided in the light receiving signal unit 27 by way of the optical fibers 25c, 25d.

The light receivers 33a, 33b convert the light fluxes incidented therein into electric signals respectively, and the electric signals are then transmitted to the signal conditioner 34. The signal conditioner 34 amplifys the electric signals to a certain degrees, and then corrects the linear relationship of the light outputs in accordance with the aforementioned equation (2).

Various levels of the light output obtained from the magneto-optical sensor of Embodiment 7 were measured by widely changing the intensity of the magnetic field. The results of the measurement are set forth in FIG. 4.

Figure 4:
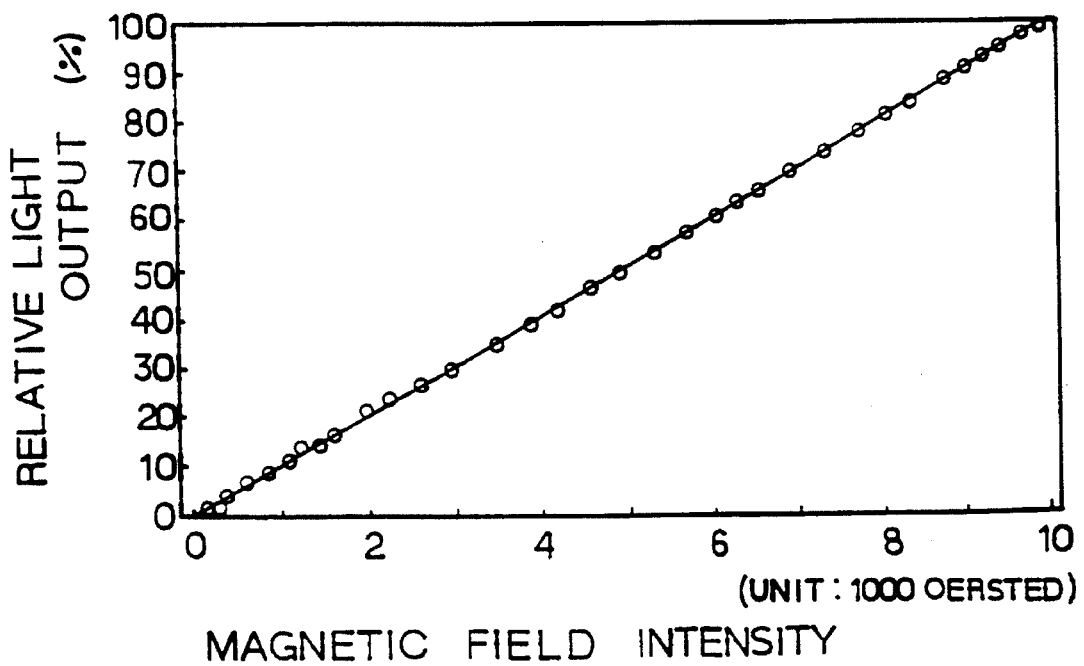
FIG. 4 is a graph showing a relationship between the magnetic field strength and the relative light output in the magneto-optical sensor shown in FIG. 3.

As is evident from FIG. 4, the relative light output is exactly proportional to the magnetic field intensity. According to the magneto-optical sensor of Embodiment 7, it was confirmed that an excellent linear relationship between the magnetic field intensity and the light output could be retained in the wide range of the magnetic field intensity from low-magnetic field of almost close to zero to high-magnetic field of about 10000 Oersted.

The reasons why such an excellent linear relationship could be obtained in the wide range of the magnetic field strength are as follows. That is, even in a low-magnetic field intensity ranging from about 50 to 1500 Oersted, a sufficient Faraday rotation angle $\theta$ of 0.27 to 0.53 degree can be obtained by the action of the Faraday element 15 for low-magnetic field use, so that an adequate and sufficient light output can be obtained from the light receiver 33a on the basis of these sufficient rotation angles.

In addition, even in high-magnetic field intensity such as 1500 to 10000 oersteds, an adequate Faraday rotation angle $\theta$ of 2.55 to 17 degrees which is not too large can be obtained by the action of the Faraday element 21 for high-magnetic field use, so that a light output excellent in linear relationship can be obtained from the light receiver 33b on the basis of these adequate rotation angles.

The signal conditioner 34 receives the electric signals each having different output levels that are outputted from the light receivers 33a, 33b. However, in the magneto-optical sensor according to Embodiment 7, a predetermined output level of the electric signal is set to as a boundary level corresponding to a certain magnetic field intensity selected from the range of low-magnetic field to high-magnetic field. The boundary level is determined on the basis of Faraday effect characteristics of both the Faraday element 15 for low-magnetic field use and the Faraday element 21 for high-magnetic field use.

Therefore, when the light output level is seemed to be less than the boundary level, the electric signal outputted from the light receiver 33a corresponding to the Faraday element 15 for low-magnetic field use is used for determining the light output and measuring the magnetic field intensity.

On the other hand, when the light output level is seemed to be higher than the boundary level, the electric signal outputted from the light receiver 33b corresponding to the Faraday element 21 for high-magnetic field use is used for determining the light output and measuring the magnetic field intensity.

By the way, as a material for forming the Faraday element for high-magnetic field use other than that used in Embodiment 7, diamagnetic materials such as $Bi_{12}SiO_{20}$, $Bi_{12}GeO_{20}$ or the like, and paramagnetic materials such as lead glass or the like are also applicable to such type of the Faraday element.

[Embodiment 8]

Figure 5:
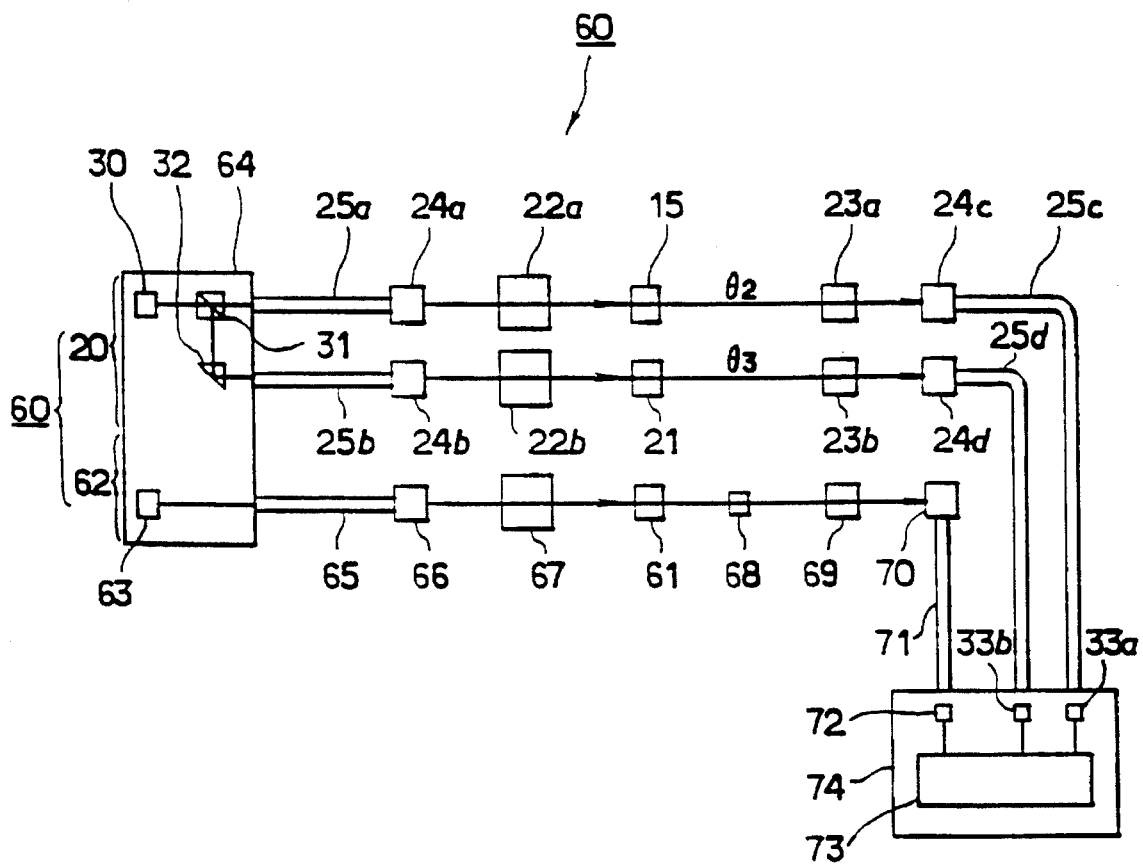
FIG. 5 is a block diagram showing still another embodiment of an optical sensor according to the present invention.
Figure 6:
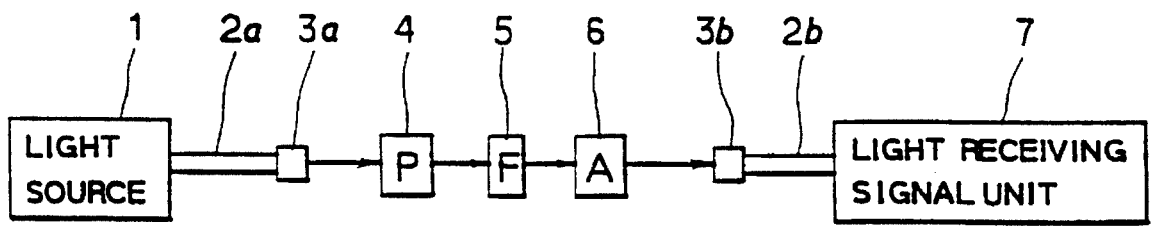
FIG. 6 is a block diagram showing a construction of a conventional magneto-optical sensor.

FIG. 5 shows a block diagram of the another embodiment of an optical sensor according to the present invention. The optical sensor 60 according to Embodiment 8 is constructed by adding an electro-optical sensor 62 for measuring voltage intensity to the magneto-optical sensor 20 shown in FIG. 3 (Embodiment 7) for measuring current intensity. Namely, the electro-optical sensor 62 including an electro-optical element 61 is arranged in parallel to the magneto-optical sensor 20 including the magneto-optical elements 15 and 21.

The electro-optical sensor 62 for measuring voltage intensity comprises: a light source 63 provided in a light irradiating unit 64 for irradiating a light beam having a wavelength of 850 nm; a collimator 66 for converting the light beam transmitted from the light source 63 through an optical fiber 65 into a parallel light flux; a polarizer 67 for converting the parallel light flux into linearly polarized light; an electro-optical element (Pockels effect element) for applying a phase difference to orthogonal components of the linearly polarized light transmitted from the polarizer 67; a quarter wave plate 68 for applying an optical bias to the linearly polarized light having the phase difference; an analyzer 69 for intensity modulating the optically biased linearly polarized light; a light receiver 72 for receiving and converting the polarized light transmitted from the analyzer 69 through a collimator 70 and an optical fiber 71 into an electrical signal in accordance with an intensity of the polarized light; and a signal conditioner 73 for processing the electrical signal thereby to output a value of voltage or electric field intensity.

In the optical sensor 20 for measuring current intensity, there is provided a magneto-optical element 15 for low-magnetic field use which is composed of magnetic garnet having a composition of $Y_{2.5}Tb_{0.5}Fe_5O_{12}$ and a film thickness of 80 μm, and is provided a magneto-optical element 21 for high-magnetic field use which is composed of diamagnetic material having a composition of ZnSn of which film thickness is 5 mm. The magneto-optical element 21 is arranged in parallel to the magneto-optical element 15.

On the other hand, in the electro-optical sensor 62, there is provided an electro-optical element (Pockels effect element) 61 having a composition of $Bi_{12}GeO_{20}$, film thickness of 8 mm, Pockels coefficient: $\gamma!_{41}=3.1\times10^{-10}$ cm/V and refractive index: $n_o=2.41$.

In the thus constructed optical sensor 60, the light beam having a wavelength of 850 nm is irradiated from the light source 63 in the light irradiating unit 64. Then, the light beam is transmitted to the collimator 66 through the optical fiber 65. The light beam is then converted into a parallel light flux by the collimator 66. Thereafter, the parallel light flux incidents into the polarizer 67 and is converted into a linearly polarized light. When the linearly polarized light is incidented into the electro-optical element 61 located in an electric field, the refractive index of the electro-optical element 61 with respect to each of orthogonal components of the linearly polarized light is varied, so that the phase difference Γ is occurred between the orthogonal components of the polarized light. The polarized light having the phase difference Γ is then applied with an optical bias by passing through a quarter wave plate 68, and is transmitted to the analyzer 69. Thereafter, the biased polarized light is modulated in intensity by passing through the analyzer 69 which is provided obliquely with respect to the polarizer 67 at an angle of 90 degrees. The intensity modulated light is then converted into a parallel light flux by the collimator 70. Subsequently, the parallel light flux is transmitted to the light receiving signal unit 74 through the optical fiber 71, and is received by the light receiver 72. The light receiver 72 converts the received light into an electric signal in proportional to an intensity of the light output. Finally, the signal conditioner 73 makes a correction for the electrical signal thereby to calculate and output a value of the electric field intensity or voltage.

On the other hand, the light source 30 provided in the light irradiating unit 64 irradiates a light beam having a wavelength of 850 nm, and the light beam is transmitted to the collimator 24a through the optical fiber 25a. Thereafter, the light beam is converted by the collimator 24a into a parallel light flux. The parallel light flux incidents into the polarizer 22a thereby to be converted into a linearly polarized light. When the linearly polarized light is incidented into the magneto-optical element 15 for low-magnetic field use, the linearly polarized light rotates at a Faraday rotation angle of $\theta_2$ which is equivalent to the intensity of an external magnetic field to be applied to the magneto-optical element 15. Subsequently, the Faraday rotated light is modulated in intensity while passing through the analyzer 23a which is disposed obliquely at an angle of 45 degrees with respect to the polarizer 22a. Thereafter, the intensity modulated light is transmitted to the light receiving signal unit 74 through the collimator 24c and the optical fiber 25c, and is incidented into the light receiver 33a. The light receiver 33a converts the incidented light into an electrical signal in proportional to the intensity of the incidented light. The signal conditioner 73 conditions or processes the electrical signal to output a value of the intensity of the external magnetic field or current.

In this eighth embodiment, the wavelength of the light beam irradiated from the light source 30 for measuring current is set to the same value of 850 nm as that of the light beam irradiated from the light source 63 for measuring voltage, so that the light outputs detected by each of the optical sensors 20 and 62 can be conditioned or processed by utilizing a single signal conditioner 73.

Furthermore, the light beam irradiated from the light source 30 in the light irradiating unit 64 is first incidented into the beam splitter 31, and then splitted into two light beams one of which directs to the optical fiber 25a and another directs to the reflecting prism 32. The light beam incidented into the reflecting prism 32 is converted its travelling direction so as to direct to the optical fiber 25b, and is transmitted to the collimator 24b. The collimator 24b converts the light beam into parallel light flux. After then, the parallel light flux is incidented into the polarizer 22b thereby to be changed into a linearly polarized light. When the linearly polarized light is incidented into the magneto-optical element 21 for high-magnetic field use, the linearly polarized light rotates at a Faraday rotation angle of $\theta_3$ which is equivalent to the intensity of the external magnetic field to be applied to the magneto-optical element 21. Subsequently, the Faraday rotated light is modulated in intensity while passing through the analyzer 23b which is disposed obliquely at an angle of 45 degrees with respect to the polarizer 22b. Thereafter, the intensity modulated light is transmitted to the light receiving signal unit 74 through the collimator 24d and the optical fiber 25d, and is incidented into the light receiver 33b. The light receiver 33b converts the incidented light into an electrical signal in proportional to the intensity of the incidented light. The signal conditioner 73 conditions or processes the electrical signal to output a value of the intensity of the external magnetic field or current.

According to the optical sensor 60 of the eighth embodiment, the light source wavelength for the magneto-optical elements 15, 21 is set to 850 nm which is the same as that for the electro-optical element 61, so that it becomes possible to commonly utilize a single light receiving signal unit for the both magnoto-optical elements 15, 21 and the electro-optical element 61.

Accordingly, there can be provided an optical sensor having a miniaturized size and high reliability in comparison with the conventional optical sensor in which the light receiving signal unit is respectively provided for each optical elements. Furthermore, it also becomes possible to provide an optical sensor enabling to measure both current intensity and voltage intensity simultaneously with low manufacturing cost.

As described hereinabove, according to the optical sensor defined in claim 1, it becomes possible to measure an intensity of magnetic field with a high sensitivity even in low-magnetic field range by virtue of the magneto-optical element for low-magnetic field use. In addition, the magneto-optical element for low-magnetic field use has a thin film thickness and is excellent in temperature characteristics. Therefore, it becomes possible to measure a current intensity even in an electric power supply system located in outdoor field. Further, advantages of excellence in mass productivity and miniaturization can be realized.

Furthermore, according to the optical sensor defined in claim 5, it becomes possible to perform measuring operation for measuring an intensity of magnetic field with high accuracy in a wide range of the magnetic field ranging from low-magnetic field to high-magnetic field.

In addition, according to the optical sensor defined in claim 8, an electro-optical element is provided in the optical sensor in parallel to the magneto-optical sensor, it becomes possible to measure not only current intensity but also voltage intensity simultaneously.

What is claimed is:

1. An optical sensor for measuring a magnetic field intensity, current intensity, electric field intensity and voltage, the optical sensor comprising:

a light irradiation means for irradiating a linearly polarized light having a wavelength of 740 to 890 nm;

a magneto-optical element having a composition of $Y_{3-x}Tb_xFe_5O_{12}$ ($0.3 \leq x \leq 0.8$) for Faraday rotating the linearly polarized light to output a rotated polarized light;

an electro-optical element (Pockels effect element) arranged in parallel to the magneto-optical element, for imparting phase difference equivalent to the electric field intensity to the polarized light so as to output a retarded polarized light; and a detecting means for detecting light outputs of the rotated polarized light which has been Faraday rotated by the magneto-optical element and the retarded polarlized light which has been imparted with the phase difference by the electro-optical element.

* * * * *